United States Patent
Sasaki et al.

(10) Patent No.: US 11,465,214 B2
(45) Date of Patent: Oct. 11, 2022

(54) COATED CUTTING TOOL

(71) Applicants: MOLDINO Tool Engineering, Ltd., Tokyo (JP); HITACHI METALS, LTD., Tokyo (JP); Oerlikon Surface Solutions AG, Pfaffikon, Pfaffikon (CH)

(72) Inventors: Tomoya Sasaki, Yasu (JP); Shuho Koseki, Tokyo (JP); Kana Morishita, Tokyo (JP); Saleh Abusuilik, Tokyo (JP); Kenichi Inoue, Tokyo (JP); Denis Kurapov, Walenstadt (CH); Wolfgang Kalss, Feldkirch (AT)

(73) Assignees: MOLDINO Tool Engineering, Ltd., Tokyo (JP); HITACHI METALS, LTD., Tokyo (JP); Oerlikon Surface Solutions AG, Pfaffikon, Pfaffikon (CH)

( * ) Notice: Subject to any disclaimer, the term of this patent is extended or adjusted under 35 U.S.C. 154(b) by 961 days.

(21) Appl. No.: 16/087,795

(22) PCT Filed: Mar. 28, 2017

(86) PCT No.: PCT/JP2017/012615
§ 371 (c)(1),
(2) Date: Sep. 24, 2018

(87) PCT Pub. No.: WO2017/170536
PCT Pub. Date: Oct. 5, 2017

(65) Prior Publication Data
US 2020/0298316 A1    Sep. 24, 2020

(30) Foreign Application Priority Data
Mar. 30, 2016  (JP) .............. JP2016-067393

(51) Int. Cl.
*B32B 9/00* (2006.01)
*B23B 27/14* (2006.01)
(Continued)

(52) U.S. Cl.
CPC .......... *B23B 27/148* (2013.01); *C23C 14/022* (2013.01); *C23C 14/024* (2013.01);
(Continued)

(58) Field of Classification Search
None
See application file for complete search history.

(56) References Cited

U.S. PATENT DOCUMENTS 7,989,092 B2 *   8/2011   Sundstrom ............ C23C 30/005
                                                    428/697
2005/0227116 A1   10/2005  Takaoka et al.
(Continued)

FOREIGN PATENT DOCUMENTS

| CA | 2916784 A1 | 1/2015 |
| CN | 1675015 A | 9/2005 |

(Continued)

OTHER PUBLICATIONS

D. V. Shtansky et al., "Comparative investigation of Ti—Si—N films magnetron sputtered using Ti5Si3+Ti and Ti5Si3+TiN targets," Surface and Coatings Technology, Elsevier, 2004, vol. 182, pp. 204-214. (cited in the JPOA).
(Continued)

*Primary Examiner* — Seth Dumbris
(74) *Attorney, Agent, or Firm* — Locke Lord LLP

(57) ABSTRACT

The present invention discloses a coated cutting tool having a hard coating film on a surface of the tool. The hard coating film is a nitride, the content ratio of titanium (Ti) with respect to a total amount of metal elements (including semimetal elements) is in a range of 70 at % to 95 at %, the
(Continued)

content ratio of silicon (Si) with respect to the total amount of metal elements (including semimetal elements) is in a range of 5 at % to 30 at %, and the content ratio of argon (Ar) with respect to the total amount of metal elements (including semimetal elements) and non-metal elements is 0.1 at % or less. The hard coating film has a NaCl type crystal structure and has an average crystal grain size in a range of 5 nm to 30 nm.

20 Claims, 2 Drawing Sheets

(51) Int. Cl.
    *C23C 14/02*     (2006.01)
    *C23C 14/06*     (2006.01)
    *C23C 14/34*     (2006.01)
    *C23C 30/00*     (2006.01)

(52) U.S. Cl.
    CPC ........ *C23C 14/0641* (2013.01); *C23C 14/345* (2013.01); *C23C 14/3464* (2013.01); *C23C 14/3485* (2013.01); *C23C 30/005* (2013.01)

(56) References Cited

U.S. PATENT DOCUMENTS

| | | |
|---|---|---|
| 2009/0214787 A1 | 8/2009 | Wei et al. |
| 2010/0322840 A1 | 12/2010 | Palmqvist et al. |
| 2014/0037943 A1 | 2/2014 | Cao |
| 2016/0177436 A1* | 6/2016 | Kurapov ............... C23C 14/352 428/446 |

FOREIGN PATENT DOCUMENTS

| | | |
|---|---|---|
| CN | 104204275 A | 12/2014 |
| CN | 105386049 A | 3/2016 |
| EP | 2591869 A1 | 5/2013 |
| JP | 2000-334606 A | 12/2000 |
| JP | 2005-344148 A | 12/2005 |
| JP | 2006-152321 A | 6/2006 |
| JP | 2008-080447 A | 4/2008 |
| JP | 2008-264971 A | 11/2008 |
| JP | 2012-045650 A | 3/2012 |
| WO | WO-2015000581 A1 * | 1/2015 ......... C23C 14/0641 |

OTHER PUBLICATIONS

International Search Report dated Jun. 13, 2017, issued for PCT/JP2017/012615 and English translation thereof.
International Preliminary Report on Patentability dated Nov. 7, 2017, issued for PCT/JP2017/012615 and English translation thereof.
Office Action dated May 29, 2018, issued for the Japanese patent application No. 2018-508068 and English translation thereof.
Office Action dated Jul. 3, 2019, issued for Chinese patent application No. 201780020507.5 and English translation thereof.
Supplementary European Search Report dated Mar. 9, 2020, issued for European Patent Application No. 17775073.4.

* cited by examiner

COATED CUTTING TOOL

TECHNICAL FIELD

The present invention relates to a coated cutting tool having a hard coating film on a surface of the tool.

Priority is claimed on Japanese Patent Application No. 2016-67393, filed Mar. 30, 2016, the content of which is incorporated herein by reference.

BACKGROUND ART

Conventionally, as a technique for improving a service life of a tool such as a cutting tool, a surface treatment technique in which a surface of the tool is covered with a hard coating film made of various ceramics has been adopted. Among hard coating films, a composite nitride coating film of Ti and Si and a composite carbonitride coating film of Ti and Si (hereinafter referred to as TiSiN and TiSiCN, respectively, in some cases) have excellent wear resistance. Therefore, a cutting tool having such a hard coating film formed thereon exhibits excellent durability in cut processing of a high-hardness steel or the like.

For example, Patent Document 1 proposes a coated cutting tool which is coated with TiSiN, in which $Si_3N_4$ and Si are present as independent phases in a compound phase. Also, Patent Document 2 proposes a coated cutting tool which is coated with TiSiN, in which microcrystals and amorphous portions are mixed with a microstructure.

DOCUMENT OF RELATED ART

Patent Document

[Patent Document 1]
Japanese Unexamined Patent Application, First Publication No. 2000-334606
[Patent Document 2]
Japanese Unexamined Patent Application, First Publication No. 2008-80447

SUMMARY OF INVENTION

Technical Problem

With conventionally proposed TiSiN, because the complete nitride is not sufficiently formed and an amorphous phase is contained in a large amount, crystallinity of a hard coating film is low. According to an examination by the present inventor, in a severe use environment where a load on a tool for high-efficiency processing of a high-hardness steel of, for example, hardness Rockwell C scale (NRC) 50 or higher, is high, tool damage is increased in a conventional tool coated with TiSiN in some cases, and thus there is room for improvement.

Solution to Problem

Accordingly, the present inventor has examined a method of enhancing heat resistance and wear resistance in nitrides mainly composed of Ti and Si. The present inventor found out that, since a nitride mainly composed of Ti and Si coated by a conventional arc ion plating method contains oxygen and carbon at a level of few at %, the content ratio of nitrogen contained in a coating film tends to decrease with respect to the content ratio of metal elements, and as a result, it is difficult for perfect nitride to be formed. The present inventor has found out that controlling a coating film structure at a micro level for a nitride mainly composed of Ti and Si and increasing the content ratio of nitrogen over a film thickness direction are effective in improving the durability of the coated cutting tool. The present inventor has solved the above problem by providing such an excellent coated cutting tool.

Aspects of the present invention have been made on the basis of the above findings, and are characterized by:

"(1) A coated cutting tool having a hard coating film on a surface of the tool, wherein the hard coating film is a nitride, a content ratio of titanium (Ti) with respect to a total amount of metal elements (including semimetal elements) is in a range of 70 at % to 95 at %, a content ratio of silicon (Si) with respect to the total amount of metal elements (including semimetal elements) is in a range of 5 at % to 30 at %; and the content ratio of argon (Ar) with respect to the total amount of metal elements (including semimetal elements) and non-metal elements is 0.1 at % or less, wherein the hard coating film has a NaCl type crystal structure and has an average crystal grain size in a range of 5 nm to 30 nm, wherein, with respect to a composition at every 20 nm of the hard coating film from a depth of 20 nm to 200 nm, a content ratio of nitrogen is 50.0 at % or higher in a case in which the total content ratio of metal elements (including semimetal elements), nitrogen, oxygen, and carbon is 100 at %.

(2) The coated cutting tool according to (1), wherein, with respect to the composition at every 20 nm of the hard coating film from the depth of 20 nm to 200 nm, a content ratio of oxygen is 3 at % or less in the case in which the total content ratio of metal elements (including semimetal elements), nitrogen, oxygen, and carbon is 100 at %.

(3) The coated cutting tool according to (1) or (2), wherein, with respect to the composition at every 20 nm of the hard coating film from the depth of 20 nm to 200 nm, a content ratio of carbon is 5 at % or less in the case in which the total content ratio of metal elements (including semimetal elements), nitrogen, oxygen, and carbon is 100 at %.

(4) The coated cutting tool according to (1) to (3), wherein, with respect to the composition at every 20 nm of the hard coating film from the depth of 20 nm to 200 nm, the total content ratio of oxygen and carbon is 3 at % or less in the case in which the total content ratio of metal elements (including semimetal elements), nitrogen, oxygen, and carbon is 100 at %.

(5) The coated cutting tool according to any one of (1) to (4), wherein, in a case in which a structure of the hard coating film is observed with a transmission electron microscope (TEM), the number of amorphous phases whose circle-equivalent diameter is 5 nm or greater present in the hard coating film is one or less within a range of 50 nm×50 nm.

(6) The coated cutting tool according to any one of (1) to (5), wherein a nano-indentation hardness of the hard coating film is in a range of 40 GPa to 60 GPa, and the elastic coefficient of the hard coating film is in a range of 400 GPa to 500 GPa.

(7) The coated cutting tool according to any one of (1) to (6), having an intermediate coating film disposed between the tool and the hard coating film.

(8) The coated cutting tool according to any one of (1) to (7), wherein, in surface and cross-section observations of the hard coating film, the number of droplets whose circle-equivalent diameter is 1.0 μm or greater is five or less per 100 μm²."

Effects of the Invention

The present invention controls a coating film structure at a micro level with respect to a nitride mainly composed of Ti and Si of a hard coating film provided at a surface of a coated cutting tool and increases a content ratio of nitrogen over a film thickness direction, thereby improving the durability of the coated cutting tool. In this way, the present invention provides an excellent coated cutting tool.

DESCRIPTION OF EMBODIMENTS

Figure 1:
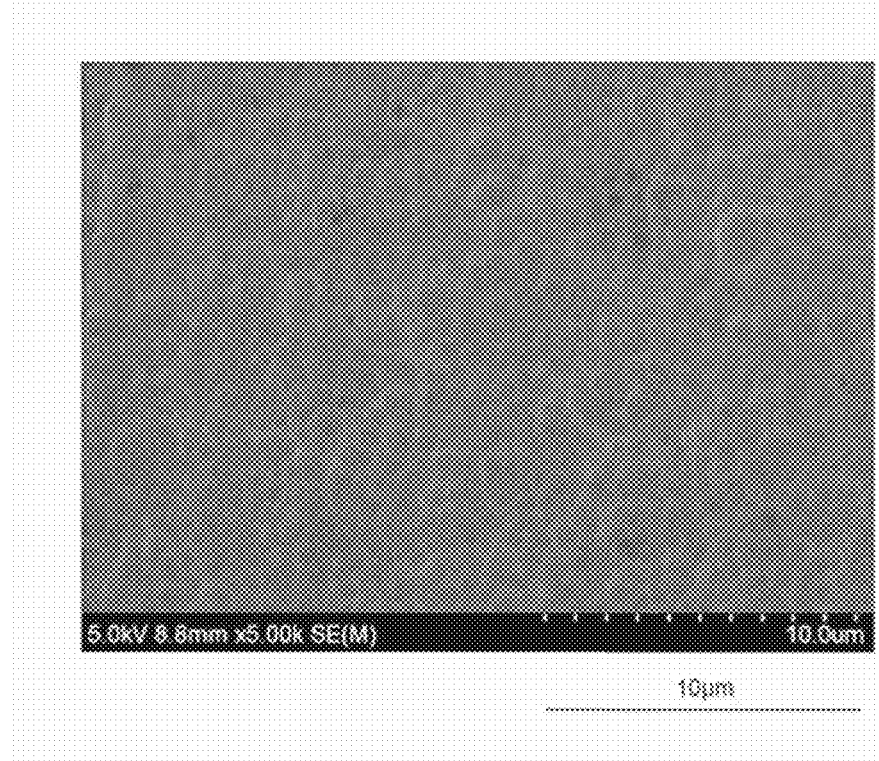
FIG. 1 is a surface observation photograph (at 5,000× magnification) of a surface of Example 1 by an electron microscope.

Hereinafter, a component composition, a structure, features, a manufacturing method, and the like of a hard coating film which constitutes a coated cutting tool of an embodiment of the present invention will be described in detail.

[1] Hard Coating Film

Component Composition (Titanium (Ti), Silicon (Si))

A hard coating film according to an embodiment of the present invention is a nitride mainly composed of Ti and Si. The nitride mainly composed of Ti and Si contains a certain amount of Si such that a structure of the hard coating film becomes finer and heat resistance and hardness increase. Also, the hard coating film has a high residual compressive stress, and by applying the hard coating film to a coated cutting tool, the durability of the cutting tool is improved.

In the following description, the simple terms "content ratio of Si" and "content ratio of Ti" refer to "content ratio of Si in the hard coating film" and "content ratio of Ti in the hard coating film," respectively.

When increasing heat resistance and hardness of the hard coating film and giving a suitable residual compressive stress to the hard coating film, it is necessary to set the content ratio of Si in metal elements (including semimetal elements; the same applies below) to be, in an atomic ratio (at %), 5 at % or higher. When the content ratio of Si increases, the amorphous phase included in the hard coating film increases, and the durability of the coated cutting tool is degraded. Thus, the content ratio of Si in the metal elements is set to be 30 at % or less. The preferable lower limit of the content ratio of Si is 10 at %. Also, the preferable upper limit of the content ratio of Si is 25 at %.

For Ti, in a case in which the content ratio of Ti is low, since wear resistance or heat resistance of the hard coating film tends to be degraded, the content ratio (at %) of Ti in the metal elements is set to be 70 at % or higher at which the hard coating film can achieve high levels of both wear resistance and heat resistance. When the content ratio of Ti increases, the content ratio of Si relatively decreases such that a coating film structure is coarsened and it becomes difficult to give a sufficient residual compressive stress to the hard coating film. Therefore, in order to finely control the structure of the hard coating film and give a suitable residual compressive stress thereto, the content ratio of Ti in the metal elements is set to be, in an atomic ratio (at %), 95 at % or less. The preferable lower limit of the content ratio of Ti is 75 at %. Also, the preferable upper limit of the content ratio of Ti is 90 at %. The hard coating film according to the present embodiment may contain other metal elements as long as it contains Ti and Si in the above-described ranges. Even in a case in which the hard coating film contains other metal elements, the total content ratio of Ti and Si is preferably 90 at % or higher.

The content ratios of the metal elements of the hard coating film can be measured using an electron probe micro-analyzer (EPMA) with a mirror-finished hard coating film as a sample. Specifically, for example, after the hard coating film is mirror-finished, five-point analysis is performed within an analysis range whose diameter is about 1 μm, and the content ratio of each metal element can be obtained from an average of the obtained measurement values.

When a film thickness of the hard coating film becomes too thin, wear resistance of the coated cutting tool tends to be degraded. Also, when the film thickness becomes too thick, the hard coating film is prone to separation. In the present embodiment, the film thickness of the hard coating film is preferably in a range of 0.3 μm to 5.0 μm. Further, the film thickness is preferably in a range of 0.5 μm to 3.0 μm.

Component Composition (Argon (Ar))

In the hard coating film of the present embodiment, a content ratio of argon (Ar) with respect to the total amount of metal elements (including semimetal elements) and nonmetal elements (the entire hard coating film) is set to be 0.1 at % or less.

In a sputtering method, since the hard coating film is coated by sputtering a target component using argon ions, it is easy to cause the hard coating film to contain argon. As will be described below, when a crystal grain size of the hard coating film is refined, the hardness increases while crystal grain boundaries increase such that argon contained in the hard coating film concentrates at the crystal grain boundaries. In a case in which the content ratio of argon of the hard coating film is high, the toughness of the hard coating film decreases and it is difficult for sufficient tool performance to be exhibited. Therefore, in the present embodiment, in order to reduce argon which concentrates at the crystal grain boundaries of the hard coating film and obtain the effect of refinement of the grain size of the hard coating film which will be described below, the content ratio of argon is set to be 0.1 at % or less. Further, the content ratio of argon (Ar) is preferably less than 0.1 at %. In the present embodiment, the lower limit of the content ratio of argon (Ar) is not particularly limited. The hard coating film according to the present embodiment may contain argon (Ar) at 0.05 at % or higher since the hard coating film is coated by the sputtering method.

Like the above-described measurement of the content ratios of the metal elements, the content ratio of argon of the hard coating film according to the present embodiment may be measured using the EPMA with a mirror-finished hard coating film as a sample. Also, like the above-described measurement of the content ratios of the metal elements, after the hard coating film is mirror-finished, five-point analysis is performed within an analysis range whose diameter is about 1 μm, and the content ratio of argon can be obtained from an average of the obtained measurement values.

In the hard coating film according to the present embodiment, as a non-metal element, argon, oxygen, and carbon may be contained in trace amount in addition to nitrogen, in some cases. The content ratio of argon can be obtained when the content ratios of the metal elements (including semimetal elements), nitrogen, oxygen, carbon, and argon is 100 at %.

Crystal Structure

It is important that the hard coating film according to the present embodiment have a NaCl type crystal structure. In the present embodiment, the hard coating film having the NaCl type crystal structure means that a peak intensity due to the NaCl type crystal structure exhibits the maximum intensity in a selected area diffraction pattern using X-ray diffraction or a transmission electron microscope (TEM). Therefore, when the peak intensity due to the NaCl type crystal structure exhibits the maximum intensity as a whole of the hard coating film, even if the hard coating film contains a hexagonal close-packed (HCP) structure or amorphous phase partially in a microanalysis using the TEM, the hard coating film is the hard coating film having the NaCl type crystal structure. On the other hand, since the hard coating film in which the peak intensity due to the HCP structure is the maximum is brittle, the durability of the coated cutting tool tends to be degraded when the hard coating film is applied to the coated cutting tool. The crystal structure of the hard coating film according to the present embodiment can be checked using, for example, a selected area diffraction pattern using X-ray diffraction or a TEM. In a case in which a test area of the coating film is small, identification of the NaCl type crystal structure by X-ray diffraction is difficult in some cases. Even in such a case, identification of the crystal structure can be performed by a selected area diffraction pattern using a TEM or the like.

The hard coating film according to the present embodiment is preferable because (200) plane due to the NaCl type crystal structure exhibits the maximum intensity such that the hard coating film tends to exhibit particularly excellent durability. When the peak intensity of (200) plane due to the NaCl type crystal structure is I(200) and the peak intensity due to (111) plane is I(111), I(200)/I(111) is preferably three or greater. Further, I(200)/I(111) is preferably four or greater. Furthermore, I(200)/I(111) is preferably five or greater.

For the hard coating film according to the present embodiment, preferably, a diffraction intensity or diffraction pattern due to the HCP structure is not checked in the crystal analysis using X-ray diffraction or a TEM.

Average Crystal Grain Size

For the hard coating film according to the present embodiment, an average crystal grain size of the hard coating film is set to be in a range of 5 nm to 30 nm. When a microstructure of the hard coating film becomes too fine, since a structure of the hard coating film becomes close to amorphous, the toughness and hardness of the hard coating film are degraded. When the crystallinity of the hard coating film is increased to reduce the brittle amorphous phase, the average crystal grain size of the hard coating film is set to be 5 nm or greater. Also, when the microstructure of the hard coating film becomes too coarse, the hardness of the hard coating film is degraded and the durability of the coated cutting tool tends to be degraded. In order to give a high hardness to the hard coating film to enhance the durability of the coated cutting tool, the average crystal grain size of the hard coating film is set to be 30 nm or less. Further, the average crystal grain size of the hard coating film is preferably 20 nm or less.

The average crystal grain size of the hard coating film can be measured from a half-width of X-ray diffraction.

Component Composition (Nitrogen (N), Oxygen (O), Carbon (C))

By sequentially analyzing the hard coating film in the film thickness direction from a surface of the hard coating film using a scanning X-ray photoelectron spectroscope, the coating film composition can be accurately measured in the film thickness direction. The present inventor evaluated nitrides of Ti and Si coated by the conventional arc ion plating method using the scanning X-ray photoelectron spectroscope. In a case in which nitrides of Ti and Si are coated by the conventional arc ion plating method, the present inventor found that, since even a nitride inevitably contains a certain amount of oxygen and carbon, and the content ratio of the nitrogen element with respect to metal elements is low, it is difficult for a complete nitride to be sufficiently formed. In a case in which nitrides are not sufficiently formed over the entire coating film, the microstructure and composition of the hard coating film are prone to non-uniformity, and thus the durability of the coated cutting tool tends to be degraded.

For the hard coating film according to the present embodiment, each film composition at every 20 nm of the hard coating film from a depth of 20 nm to 200 nm is analyzed using the scanning X-ray photoelectron spectroscope, and as a result of analysis of each composition, in a composition at each depth position, the content ratio of nitrogen is 50.0 at % or higher in a case in which the total content ratio of metal elements (including semimetal elements), nitrogen, oxygen, and carbon is 100 at %. By increasing the content ratio of nitrogen contained in the hard coating film in the film thickness direction, sufficient nitrides can be formed in the entire hard coating film, and the heat resistance of the hard coating film can be improved. Particularly, when the content ratio of nitrogen is 50.0 at % or higher, sufficient nitrides are formed, and the heat resistance of the hard coating film tends to be improved.

In a method of analyzing the hard coating film of the present embodiment, for the hard coating film, an analysis of a coating film composition is performed every 20 nm-etching from a depth of 20 nm so that composition analysis is performed in the range from the surface of the hard coating film to the depth of 200 nm. In the composition analysis, the content ratio of each element is calculated while the total content ratio of carbon, nitrogen, oxygen, and metal elements (including semimetal elements) is 100 at %. In the present measurement method, since an analysis value less than 1 at % does not have sufficient measurement accuracy, values less than 1 at % are indicated as "-" in Tables 2, 3, 5, and 6 which are referred to in examples described below. Also, since large amounts of oxygen and carbon, which are inevitable impurities, are detected from the outermost surface of any sample, analysis is performed from a position of 20 nm-depth from the coating film surface.

For the hard coating film according to the present embodiment, each film composition at every 20 nm of the hard coating film from a depth of 20 nm to 200 nm is analyzed using the scanning X-ray photoelectron spectroscope, and as a result of analysis of each composition, the content ratio of nitrogen is preferably 51 at % or higher in a case in which the total content ratio of metal elements (including semimetal elements), nitrogen, oxygen, and carbon in each composition is 100 at %. However, when the content ratio of nitrogen exceeds 55 at %, since the residual compressive stress of the hard coating film becomes too high and the hard coating film becomes more likely to cause self-destruction, the content ratio of nitrogen is preferably 55 at % or less.

With respect to a measurement position, since large amounts of oxygen and carbon, which are inevitable impurities, are detected from the outermost surface, the outermost surface is avoided, and the measurement is performed every 20-nm depth from a position at which a depth from the coating film surface is 20 nm. Also, when the desired composition range is satisfied at least up to a depth of 200 nm from the coating film surface with respect to nitrogen, oxygen, and carbon, since nitrides mainly composed of Ti and Si in which the nitride is sufficiently formed can be regarded as being formed at a certain film thickness, the hard coating film that exhibits the effect of the present invention can be specified.

For the hard coating film according to the present embodiment, in each composition at every 20 nm of the hard coating film from a depth of 20 nm to 200 nm, preferably, the content ratio of oxygen is 3 at % or less. More preferably, the content ratio of oxygen is 2 at % or less. When the content ratio of oxygen included in the hard coating film becomes very low, the crystallinity of the hard coating film tends to increase.

For the hard coating film according to the present embodiment, in a range within 100 nm from the surface of the hard coating film, preferably, a region in which the content ratio of oxygen is 1.5 at % or less is present. By providing a region in which the content ratio of oxygen is very low, i.e., 1.5 at % or less, at a surface portion of the hard coating film, the heat resistance of the hard coating film tends to further increase. Although the hard coating film according to the present embodiment tends to contain a small amount of oxygen, oxygen bound to silicon or titanium is present to some extent in the hard coating film.

For the hard coating film according to the present embodiment, in each composition at every 20 nm of the hard coating film from a depth of 20 nm to 200 nm, preferably, the content ratio of carbon is 5 at % or less in a case in which the total content ratio of metal elements (including semimetal elements), nitrogen, oxygen, and carbon is 100 at %. Further, the content ratio of carbon is preferably 4 at % or less in each composition at every 20 nm of the hard coating film from the depth of 20 nm to 200 nm. Since carbon is also reduced in addition to inevitable oxygen included in the hard coating film, the heat resistance of the hard coating film tends to further increase.

For the hard coating film according to the present embodiment, in each composition at every 20 nm of the hard coating film from a depth of 20 nm to 200 nm, preferably, the total content ratio of oxygen and carbon is 3 at % or less in a case in which the total content ratio of metal elements (including semimetal elements), nitrogen, oxygen, and carbon is 100 at %. Also, preferably, the total content ratio of oxygen and carbon is 2 at % or less. By limiting the content ratio of the total amount of oxygen and carbon in addition to limiting the content ratios of oxygen and carbon individually, the heat resistance of the hard coating film tends to be further improved.

The size of the amorphous phase included in the hard coating film can be evaluated by a nano beam diffraction pattern of a TEM. By evaluating a nano beam diffraction pattern of the hard coating film by using a nano beam having a beam diameter of 5 nm, whether a certain region of the hard coating film is a crystalline phase or an amorphous phase can be checked. That is, at a measurement position where a bright spot corresponding to the crystalline phase does not appear in a diffraction pattern, an amorphous phase whose circle-equivalent diameter is 5 nm or greater and greater than the beam diameter is present. Then, in a 50 nm×50 nm region, by performing structure observation using a TEM and performing measurement of a nano beam diffraction pattern, the number of amorphous phases whose circle-equivalent diameter is 5 nm or greater can be obtained. When evaluating the uniformity in the microstructure, the 50 nm×50 nm range may be evaluated with two or more fields of view.

For the hard coating film according to the present embodiment, preferably, the number of amorphous phases whose circle-equivalent diameter is 5 nm or greater is one or less within the 50 nm×50 nm range. Further, the number of amorphous phases is preferably zero. Furthermore, preferably, the number of amorphous phases whose circle-equivalent diameter is 10 nm or greater is zero within the 50 nm×50 nm range.

Hardness (Nano-Indentation Hardness), Elastic Coefficient

By increasing a nano-indentation hardness of the hard coating film according to the present embodiment, the durability of the coated cutting tool tends to be improved. On the other hand, when the nano-indentation hardness is too high, the coating film becomes brittle, and the durability of the coated cutting tool tends to be degraded. Therefore, preferably, the nano-indentation hardness of the hard coating film according to the present embodiment is set to be in a range of 40 GPa to 60 GPa. Further, preferably, the nano-indentation hardness of the hard coating film is set to be 50 GPa or higher. Furthermore, preferably, the nano-indentation hardness of the hard coating film is set to be 55 GPa or higher. Also, by increasing the coating film hardness and setting the elastic coefficient of the hard coating film to be 400 GPa or higher, more excellent durability can be given to the coated cutting tool. Further, preferably, the elastic coefficient of the hard coating film is set to be 450 GPa or higher. In order to give more excellent toughness to the hard coating film, preferably, the elastic coefficient of the hard coating film is set to be 500 GPa or lower.

The nano-indentation hardness and elastic coefficient of the hard coating film in the present embodiment can be measured using a nano-indentation apparatus (ultra-micro indentation hardness tester ENT-1100a manufactured by ELIONIX INC.). In the measurement, a terminal is pressed from the surface of the hard coating film under measurement conditions of an indentation load of 49 mN, a maximum load maintaining time of 1 second, and a removal rate of 0.49 mN/sec after load applying, and measurement is performed at ten points at the maximum depth at which the indentation depth is maintained to be 1/10 of the thickness of the hard coating film or less. Among the measurement values of the ten points, the nano-indentation hardness and the elastic coefficient are obtained from an average value of six points, excluding two points on the larger value side and two points on the smaller value side.

Suppression of Droplet

When a coarse droplet is included in the hard coating film, the coating film destruction with the droplet as a starting point is prone to occur, and thus the durability of the coated cutting tool is degraded. Particularly, when coarse droplets whose circle-equivalent diameter is 1 μm or greater are present in large numbers at the surface of or inside the hard coating film, sudden defects or the like are prone to occur, and the durability of the coated cutting tool tends to be degraded. Even when only the surface of the coating film is smoothed, when coarse droplets are included in large numbers inside the coating film, the coating film destruction with the droplets as starting points is prone to occur. Therefore, in surface and cross-section observations of the hard coating film, preferably, the number of droplets whose circle-equivalent diameter is 1 μm or greater is five or less per 100 μm$^2$. By reducing the number of coarse droplets present at the surface of the hard coating film, sudden breakage of the coated cutting tool can be suppressed, which is preferable. Further, in surface and cross-section observations of the hard coating film, preferably, the number of droplets whose circle-equivalent diameter is 1 μm or greater is three or less per 100 μm$^2$. Furthermore, the number of droplets is 2 or less.

In a case of a small-diameter tool having a tool diameter of 1 mm or less, since an influence of the droplets on the tool diameter becomes large, even when the circle-equivalent diameter of the droplets is less than 1 μm, there is a concern that the droplets may become starting points of the coating film destruction. Therefore, it is preferable to reduce even the number of droplets whose circle-equivalent diameter is less than 1 μm as much as possible. Further, in surface and cross-section observations of the hard coating film, preferably, the number of droplets whose circle-equivalent diameter is 0.5 μm or greater and less than 1.0 μm is five or less per 100 μm$^2$. Further, in surface and cross-section observations of the hard coating film, preferably, the number of droplets whose circle-equivalent diameter is 0.5 μm or greater and less than 1.0 μm is three or less per 100 μm2, and furthermore, the number of droplets is 2 or less.

The droplets on the surface of the hard coating film can be obtained by observing the surface of the hard coating film using a scanning electron microscope (SEM) or the like. Also, when evaluating the droplets in the cross-section observation of the hard coating film, the droplets are processed using a focusing ion beam method, and the mirror-finished surface of the hard coating film is observed in multiple fields of view at 5,000 to 10,000× magnification using a TEM.

Other Additive Elements

In the hard coating film according to the present embodiment, for the purpose of improving the wear resistance, heat resistance, or the like of the hard coating film, one or more elements selected from the elements of Groups 4a, 5a, 6a of the periodic table and B, Y may be included in an amount of 5 at % or less with respect to the hard coating film.

Intermediate Coating Film, Etc.

In the coated cutting tool of the present embodiment, in order to further improve adhesiveness of the hard coating film, an intermediate layer may be separately provided between a base material of the tool and the hard coating film as necessary. For example, a layer formed of any one of a metal, nitride, carbonitride, and carbide may be provided between the base material of the tool and the hard coating film. Particularly, it is preferable that nitrides of Al and Ti be provided as the intermediate layer.

Also, a mixed gradient coating film which is mixed with another hard coating film having a different component ratio may be provided between the hard coating film according to the present embodiment and the base material of the tool. Also, a hard coating film having a different component ratio or different composition from that of the hard coating film according to the present embodiment may be separately formed on the hard coating film according to the present embodiment. In addition, the hard coating film according to the present embodiment and the hard coating film having a different component ratio or different composition from that of the hard coating film according to the present embodiment may be caused to be laminated on each other.

[2] Film Forming Method of Hard Coating Film

In the coating of the hard coating film according to the present embodiment, it is preferable to apply a sputtering method, in which a target component is sputtered to coat the hard coating film, from among physical vapor deposition methods.

In the physical vapor deposition methods, a residual compressive stress is given to the hard coating film and chipping resistance tends to be excellent. Among the physical vapor deposition methods, the arc ion plating method has been widely applied since an ionization rate of a target component tends to be high and the adhesiveness of the hard coating film tends to be excellent. However, in the arc ion plating method, since the target component is melted by the arc discharge, inevitable impurities such as oxygen and carbon contained in a furnace are prone to being introduced into the hard coating film, and it tends to be difficult to obtain a hard coating film having a high nitrogen content ratio.

Accordingly, by applying a sputtering method in which a target is not melted, the inevitable impurities such as oxygen or carbon contained in the hard coating film tend to be reduced. However, in a conventional DC sputtering method or high-output sputtering method in which high power is simply applied to the target, since the ionization rate of the target is low, an amount of nitrides formed in the hard coating film is not sufficient. Therefore, from among sputtering methods, by applying a sputtering method in which power is sequentially applied to a target, when the target to which power is applied is switched, it is preferable to provide a time during which power is simultaneously applied to both a target for which application of power is ended and a target for which application of power is started.

By coating the hard coating film with such a sputtering method, a state in which the ionization rate of the target is high is maintained during film formation. Thus, the crystallinity of the hard coating film tends to be high, and sufficient nitrides tend to be formed.

In order to form sufficient nitrides in the hard coating film, preferably, the maximum power density of a power pulse is set to be 1.0 kW/cm$^2$ or higher. However, when the density of power applied to the target becomes too high, it is difficult for film formation to be stabilized. Therefore, preferably, the maximum power density of a power pulse is set to be 3.0 kW/cm$^2$ or lower. Also, in a case in which a time during which power is simultaneously applied to both an alloy target for which application of power is ended and an alloy target for which application of power is started is too short or too long, since ionization of a target is not sufficient, it is difficult for sufficient nitrides to be formed in the hard coating film. Therefore, preferably, the time during which power is simultaneously applied to both an alloy target for which application of power is ended and an alloy target for which application of power is started is set to be in a range of 5 microseconds to 20 microseconds. In order to increase the ionization rate of a target component, it is preferable to use three or more TiSi-based alloy targets.

Also, it is preferable to perform a preliminary discharge by setting an in-furnace temperature of a sputtering apparatus to be 430 ° C. or higher and set a flow rate of nitrogen gas introduced into the furnace to be 60 sccm or higher and a flow rate of argon gas to be in a range of 70 sccm to 200 sccm. Also, it is preferable to set an in-furnace pressure to be in a range of 0.5 Pa to 0.7 Pa. By coating the hard coating film under the above conditions, it is easy for the content ratios of argon and oxygen in the hard coating film to be reduced while the content ratio of nitrogen is increased. Also, when the hard coating film is set to have the NaCl type crystal structure and the microstructure with high crystallinity, preferably, a negative bias voltage applied to the cutting tool, which serves as a substrate, is controlled to be in a range of −55 V to −20 V.

The coated cutting tool of the present embodiment can be used for cutting tools used for cut processing of a high-hardness steel, stainless steel, heat-resistant steel, cast iron steel, and carbon steel, for example. Specifically, the coated cutting tool can be used in the form of a ball end mill, square end mill, radius end mill, multi-blade end mill, insert, drill, cutter, broach, reamer, hob, router, and the like.

Hereinafter, the present invention will be described in more detail with reference to examples, but the present invention is not limited to the following examples.

EXAMPLES

First Example

Tool

As a tool, a two-blade ball end mill (ball radius 5 mm, manufactured by Mitsubishi Hitachi Tool Engineering, Ltd.) made of a cemented carbide alloy having a composition of WC(bal.)-Co (8.0 mass %)-Cr (0.5 mass %)-VC (0.3 mass %), a WC average particle size of 0.6 μm, a hardness of 93.9 HRA (Rockwell hardness, a value measured according to JIS G 0202) was prepared.

In Example 1 and Comparative Example 1, a sputtering apparatus capable of mounting six sputter evaporation sources was used. From among these evaporation sources, three AlTi-based alloy targets and three TiSi-based alloy targets were installed as evaporation sources in the sputtering apparatus. A target having a dimension of Φ16 cm and thickness of 12 mm was used. In Example 1 and Comparative Example 1, the composition of the TiSi-based alloy target used was changed.

The tool was fixed to a sample holder in the sputtering apparatus, and a bias power supply was connected to the tool. Note that the bias power supply has a structure in which a negative bias voltage is applied to the tool independently of the target. The tool rotates at two revolutions per minute and revolves through a fixing jig and the sample holder. The distance between the tool and a target surface was set to 100 mm.

Introduced gas was introduced from a gas supply port provided in the sputtering apparatus using Ar and $N_2$.

Bombardment Processing

Before coating the tool with the hard coating film, bombardment processing was performed on the tool by the following procedure. The tool was heated for 30 minutes in a state in which the in-furnace temperature of the sputtering apparatus reached 430° C. by a heater in the sputtering apparatus. Subsequently, the interior of the furnace of the sputtering apparatus was evacuated, and the in-furnace pressure was set to be $5.0 \times 10^{-3}$ Pa or lower. Then, Ar gas was introduced into the furnace of the sputtering apparatus, and the in-furnace pressure was adjusted to 0.8 Pa. Then, a DC bias voltage of −170 V was applied to the tool to perform cleaning (bombardment processing) of the tool with Ar ions.

Film Formation of Intermediate Coating Film

Then, an intermediate coating film of AlTiN was coated on the tool by the following procedure.

While the in-furnace temperature was maintained at 430° C., Ar gas was introduced at 160 sccm into the furnace of the sputtering apparatus, and then, $N_2$ gas was introduced at 120 sccm into the furnace so that the in-furnace pressure was adjusted to 0.60 Pa. A DC bias voltage of −60 V was applied to the tool. Power was sequentially applied while switching the three AlTi-based alloy targets while a discharge time per cycle of power applied to alloy targets containing Al and Ti was set to be 4.0 milliseconds. A time during which power is simultaneously applied to both an alloy target for which application of power is ended and an alloy target for which application of power is started when switching an alloy target to which power is applied was set to be 10 microseconds. In this way, an intermediate coating film having a thickness of about 1.5 μm was coated on a surface of the tool. Here, the maximum power density of a power pulse was set to be 1.5 kW/cm$^2$, and the average power density was set to be 0.37 kW/cm$^2$.

Film Formation of Hard Coating Film

Then, the hard coating film was coated on the intermediate coating film by the following procedure.

While the in-furnace temperature was maintained at 430° C., Ar gas was introduced at 160 sccm into the furnace of the sputtering apparatus, and then, $N_2$ gas was introduced at 80 sccm into the furnace so that the in-furnace pressure was adjusted to 0.52 Pa. A DC bias voltage of −40 V was applied to the tool. Power was sequentially applied while switching the three TiSi-based alloy targets while a discharge time per cycle of power applied to alloy targets containing Ti and Si was set to be 4.0 milliseconds. A time during which power is simultaneously applied to both an alloy target for which application of power is ended and an alloy target for which application of power is started when switching an alloy target to which power is applied was set to be 10 microseconds. In this way, a hard coating film having a thickness of about 1.5 μm was coated on the intermediate coating film.

Here, the maximum power density of a power pulse was set to be 1.5 kW/cm$^2$, and the average power density was set to be 0.37 kW/cm$^2$.

In Comparative Example 2, a sample coated by a sputtering method using a different apparatus from Example 1 and Comparative Example 1 was prepared.

For film formation, a sputtering apparatus in which a single AlTi-based alloy target and a single TiSi-based alloy target are provided in an evaporation source was used. Also, a target having a dimension of 500 mm×88 mm and a thickness of 10 mm was used. Like the above example, cleaning of the tool was performed with Ar ions.

The interior of the furnace of the sputtering apparatus was evacuated such that the in-furnace pressure was 5.0×10$^{-3}$ Pa or lower, and while the in-furnace temperature was 430° C., Ar gas and N$_2$ gas were introduced into the furnace of the sputtering apparatus so that the in-furnace pressure was adjusted to 0.6 Pa. Then, a DC bias voltage of −100 V was applied to the tool, and power of 5 kW was supplied to the AlTi-based alloy target to coat an intermediate coating film having a thickness of about 1.5 μm.

Then, while the tool temperature was maintained at 430° C., Ar gas and N$_2$ gas were introduced into the furnace so that the in-furnace pressure was adjusted to 0.6 Pa. Then, a DC bias voltage of −80 V was applied to the tool, and power of 5 kW was supplied to the TiSi-based alloy target to coat a hard coating film having a thickness of about 1.5 μm.

In Comparative Example 3, a sample coated by an arc ion plating method was prepared.

For film formation, an arc ion plating apparatus in which a single AlTi-based alloy target and a single TiSi-based alloy target are provided in an evaporation source was used. Also, a target having a dimension of Φ10.5 cm and a thickness of 16 mm was used. Like the above example, cleaning of the tool was performed with Ar ions.

The interior of the furnace of the arc ion plating apparatus was evacuated such that the in-furnace pressure was 5.0×10$^{-3}$ Pa or lower, and while the in-furnace temperature was 430° C., N$_2$ gas was introduced into the furnace of the arc ion plating apparatus so that the in-furnace pressure was adjusted to 4.0 Pa. Then, a DC bias voltage of −50 V was applied to the tool, and current of 150 A was supplied to the AlTi-based alloy target to coat an intermediate coating film having a thickness of about 1.5 μm.

Then, while the in-furnace temperature was maintained at 430° C., N$_2$ gas was introduced into the furnace so that the in-furnace pressure was adjusted to 4.0 Pa. Then, a bias voltage of −50 V was applied to the tool, and current of 150 A was supplied to the TiSi-based alloy target to coat a hard coating film having a thickness of about 1.5 μm.

Coating Film Composition

The coating film composition of the hard coating film was measured using an electron probe microanalyzer (JXA-8500F manufactured by JEOL Ltd.). Specifically, the coating film composition of the hard coating film was measured with a wavelength-dispersive electron probe microanalysis (WDS-EPMA) attached to the apparatus. A ball end mill for evaluating physical properties was mirror-finished to serve as a sample. Under measurement conditions including an accelerating voltage of 10 kV, irradiation current of 5×10$^{-8}$ A, and introduction time of 10 seconds, five points were measured within a range of an analysis region having a diameter of 1 μm, and from an average value thereof, the metal content ratio of the hard coating film and the content ratio of Ar in the total of the metal components and non-metal components were obtained.

Crystal Structure and Crystal Grain Size

The crystal structure of the hard coating film was specified using an X-ray diffraction apparatus (RINT2000 vertical goniometer fixed monochromator manufactured by Rigaku Corporation). Checking of the crystal structure was performed under measurement conditions including a tube voltage of 40 kV, a tube current of 300 mA, an X-ray source of Cukα (λ=0.15418 nm), and 2θ being in a range of 20 to 70°. The average crystal grain size of the hard coating film was measured from a half-width of the peak intensity of (200) plane of the hard coating film.

Coating Film Hardness and Elastic Coefficient

The coating film hardness and elastic coefficient of the hard coating film were analyzed using a nano-indentation tester (ENT-1100a manufactured by Elionix Co. Ltd.). In the analysis, after mirror-polishing of a coating film cross-section at which a test piece was tilted 5° with respect to the outermost surface of the coating film, a region where the maximum indentation depth in the polished surface of the coating film was less than approximately ¹⁄₁₀ of the film thickness was selected. By measuring ten points under a measurement condition including an indentation load of 49 mN/s, the coating film hardness and the elastic coefficient were obtained from an average value of six points, excluding two points on the larger value side and two points on the smaller value side.

TEM Analysis

Observation of a microstructure was performed using a TEM. Also, using a nano beam having a beam diameter of 5 nm, a presence of an amorphous phase whose circle-equivalent diameter is 5 nm or greater was checked from a 50 nm×50 nm region.

Cutting Test

A cutting test was performed using the manufactured coated cutting tool. An analysis result and cutting test result are shown in Table 1. Cutting conditions are as follows.

(Conditions) Wet Processing

Tool: two-blade cemented carbide ball end mill
Model name: EPBTS2100, ball radius 5.0 mm
Cutting method: bottom-surface cutting
Work material: HPM38 (52 HRC) (manufactured by Hitachi Metals, Ltd.)
Cutting Depth: axial direction, 0.2 mm, radial direction, 0.2 mm
Cutting speed: 314.0 m/min
Cutting oil: pressurized supply of water-soluble emulsion
Cutting distance: 300 m
Evaluation method: After cut processing, observation was performed at 150× magnification using a SEM, a width of abrasion of the tool and the work material was measured, and a width of a portion at which the abrasion width was the largest was set as the maximum abrasion width.

Coating film properties and a coating film structure were observed for each sample. The coating film properties and the results of cutting evaluation are shown in Table 1.

TABLE 1

| | Coating film composition (at %) | Ar content ratio (at %) | Crystal structure | I(200)/ I(111) | Average crystal grain size (nm) | Nano-indentation hardness (GPa) | Elastic coefficient (GPa) | Maximum abrasion width (μm) |
|---|---|---|---|---|---|---|---|---|
| Example 1 | (Ti88Si12)N | 0.06 | fcc(200) | 6.0 | 7 | 50 | 432 | 42 |
| Comparative Example 1 | (Ti98Si2)N | 0.09 | fcc(200) | 5.1 | 6 | 41 | 435 | 60 |
| Comparative Example 2 | (Ti84Si16)N | 0.24 | fcc(200) | 1.3 | 5 | 38 | 316 | Separated |
| Comparative Example 3 | (Ti82Si18)N | 0 | fcc(200) | 7.1 | 7 | 48 | 515 | 64 |

As compared with Comparative Example 3 in which a sample was coated with the conventional arc ion plating method, it was confirmed that the maximum abrasion width was suppressed by about 20 μm and excellent durability was exhibited in Example 1. "fcc" in Table 1 represents a face-centered cubic lattice structure.

In Comparative Example 1, since the content ratio of Si of the hard coating film was low, the hardness and heat resistance were degraded, and the abrasion width increased in comparison to Example 1.

Comparative Example 2 was a hard coating film coated by the conventional DC sputtering method. Since the content ratio of Ar of the hard coating film was higher in comparison to Example 1, hardness was low. Therefore, separation of a coarse coating film occurred at an early stage.

The hard coating films of Example 1 and Comparative Example 3 were fine crystal structures having an average crystal grain size of 7 nm, and a coarse amorphous phase whose circle-equivalent diameter is 5 nm or greater was not observed in microstructure observation. Accordingly, in order to clarify a difference in durability between Example 1 and Comparative Example 3, composition analysis in the film thickness direction was performed on Example 1 and Comparative Example 3 using a scanning X-ray photoelectron spectroscope.

Measurement of Atomic Concentration Distribution in Depth Direction from Surface Measurement of atomic concentration distribution in a depth direction from a surface of the coating film was performed on Example 1 and Comparative Example 3 using a scanning X-ray photoelectron spectroscope (Quantum-2000 manufactured by ULVAC-PHI, Inc.). In the analysis, the measurement was performed using an X-ray source of AlKα, an analysis region having a dimension of Φ20 μm, and an electron neutralizing gun. In order to measure an atomic distribution in the depth direction of the coating film, an Ar ion gun was used, etching was performed at a speed of 10 nm/min in terms of $SiO_2$, and analysis of coating film composition was performed every 20 nm-etching to perform the analysis up to 200 nm-depth from the surface of the hard coating film.

The composition analysis was performed while the total content ratio of carbon, nitrogen, oxygen, silicon, and titanium was 100 at %. Also, metal elements (including semi-metal elements) other than those mentioned above were not included in the hard coating film. The analysis result of Example 1 is shown in Table 2. The analysis result of Comparative Example 3 is shown in Table 3. In the present measurement method, since an analysis value less than 1 at % does not have sufficient measurement accuracy, values less than 1 at % are indicated as "–" in Tables 2 and 3. Also, since large amounts of oxygen and carbon, which are inevitable impurities, are detected from the outermost surface of any sample, analysis is performed from a position of 20 nm-depth from the coating film surface.

TABLE 2

| Depth from surface of coating film | (at %) | | | | |
|---|---|---|---|---|---|
| (nm) | C | N | O | Si | Ti |
| 20 | — | 52.1 | 1.8 | 5.8 | 40.3 |
| 40 | — | 52.5 | — | 6.6 | 40.9 |
| 60 | — | 52.8 | — | 5.9 | 41.3 |
| 80 | — | 52.5 | — | 5.9 | 41.6 |
| 100 | — | 52.7 | — | 6.4 | 40.9 |
| 120 | — | 53.4 | — | 5.5 | 41.1 |
| 140 | — | 52 | 1.5 | 6 | 40.5 |
| 160 | — | 51.9 | 1.9 | 6.5 | 39.7 |
| 180 | — | 51.6 | 1.3 | 6.3 | 40.8 |
| 200 | — | 52.7 | 1.6 | 4.7 | 41 |

TABLE 3

| Depth from surface of coating film | (at %) | | | | |
|---|---|---|---|---|---|
| (nm) | C | N | O | Si | Ti |
| 20 | 20.7 | 40.5 | 2.7 | 5.2 | 30.9 |
| 40 | 19.4 | 40.9 | 2.6 | 5 | 32.1 |
| 60 | 11.7 | 43.7 | 3.9 | 5.5 | 35.2 |
| 80 | 12 | 44.4 | 2.5 | 5.5 | 35.6 |
| 100 | 9.6 | 46 | 2.3 | 5.6 | 36.5 |
| 120 | 7.3 | 47.1 | 2.4 | 5.9 | 37.3 |
| 140 | 6.7 | 47.4 | 2.5 | 6.1 | 37.3 |
| 160 | 5.8 | 48.1 | 1.5 | 5.8 | 38.8 |
| 180 | 5.6 | 47.7 | 2.4 | 6.3 | 38 |
| 200 | 4.3 | 49.8 | 2 | 5.5 | 38.4 |

In Comparative Example 3 in which a sample was coated with the conventional arc ion plating method, since the content ratios of oxygen and carbon were high in the film thickness direction, the content ratio of nitrogen was less than 50.0 at %, and sufficient nitrides were not formed throughout the hard coating film. On the other hand, it was confirmed that the content ratios of oxygen and carbon were low in the film thickness direction and the content ratio of nitrogen was 50.0 at % or higher in Example 1. Since the content ratio of nitrogen was high in the film thickness direction of the hard coating film and sufficient nitrides were formed throughout the hard coating film in Example 1, it is presumed the abrasion width is suppressed in Example 1 in comparison to Comparative Example 3 in which a sample was coated with the conventional arc ion plating method.

Also, even at a position at which the depth from the surface was greater than 200 nm, it was confirmed that the amount of oxygen or carbon was small and the content ratio of nitrogen was 50.0 at % or higher in Example 1, and the amount of oxygen or carbon was large and the content ratio of nitrogen was less than 50.0 at % in Comparative Example 3 in which a sample was coated with the conventional arc ion plating method.

Figure 2:
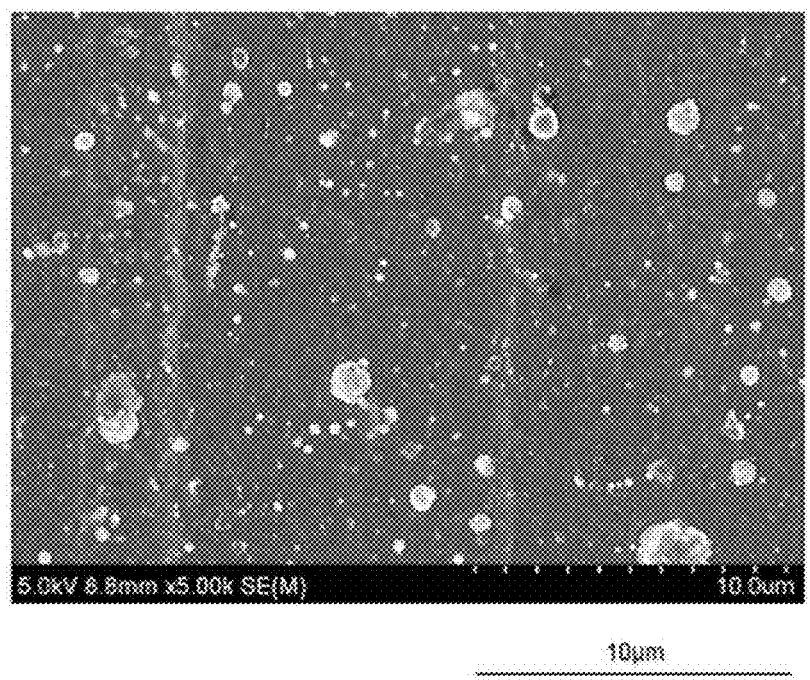
FIG. 2 is a surface observation photograph (at 5,000× magnification) of a surface of Comparative Example 3 by an electron microscope.
Figure 3:
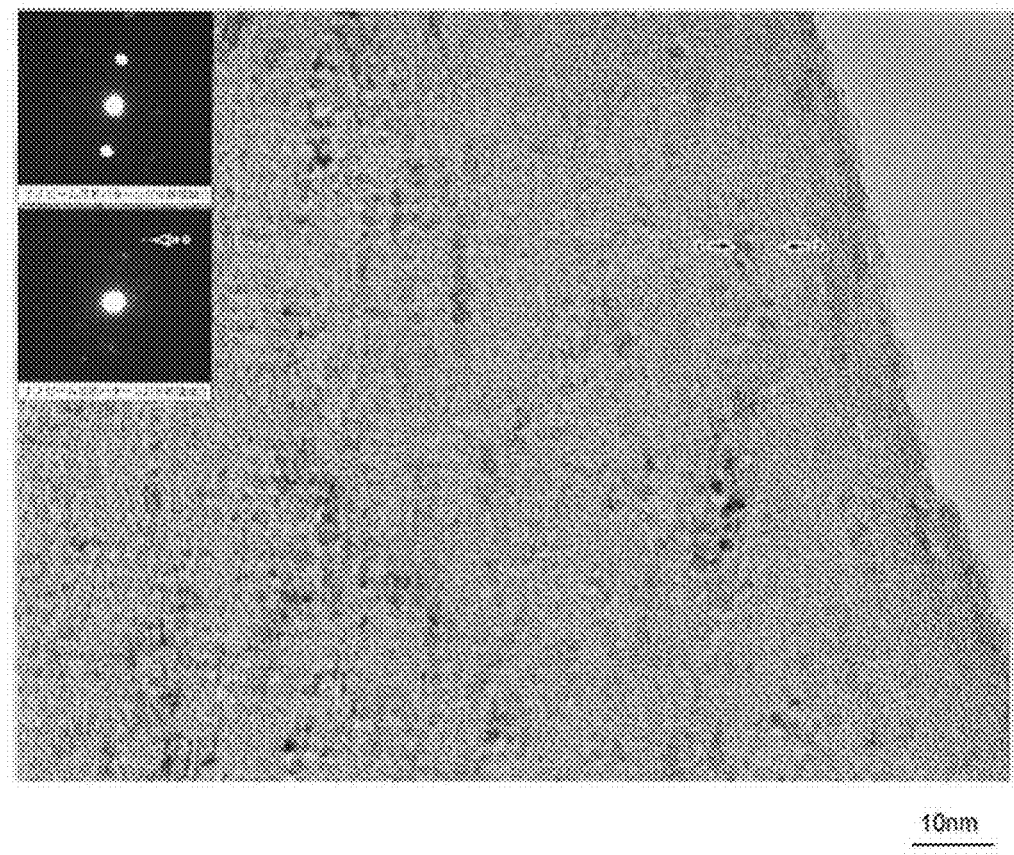
FIG. 3 is an example showing a transmission electron microscope (TEM) image and a nano beam diffraction pattern of Example 1 together with a TEM image.

A surface observation photograph by an SEM of Example 1 is shown in FIG. 1. A surface observation photograph by an SEM of Comparative Example 3 is shown in FIG. 2. In Example 1, the presence of coarse droplets whose circle-equivalent diameter exceeds 1.5 μm was not confirmed, and the number of droplets whose circle-equivalent diameter is in a range of 1.0 μm to 1.5 μm was three per 100 μm² of the surface of the hard coating film. The number of droplets whose circle-equivalent diameter is 0.5 μm or greater and less than 1.0 μm was two per 100 μm² of the surface of the hard coating film. In observation of the mirror-finished cross-section, the number of droplets whose circle-equivalent diameter is in the range of 1.0 μm to 1.5 μm was one per 100 μm², and the number of droplets whose circle-equivalent diameter is 0.5 μm or greater and less than 1.0 μm was one per 100 μm².

On the other hand, in Comparative Example 3 in which a sample was coated by the arc ion plating method, the number of droplets whose circle-equivalent diameter is 1.0 μm or greater was ten or more, and the presence of coarse droplets whose circle-equivalent diameter is 2.0 μm or greater was also confirmed. The number of droplets whose circle-equivalent diameter is 0.5 μm or greater and less than 1.0 μm was about forty per 100 μm² of the surface of the hard coating film. Likewise, in observation of the mirror-finished cross-section, the number of droplets whose circle-equivalent diameter is 1.0 μm or greater was ten or more per 100 μm², and the number of droplets whose circle-equivalent diameter is 0.5 μm or greater and less than 1.0 μm was about forty per 100 μm².

In the above-described example, evaluation was performed using a large-diameter ball end mill with a tool diameter of 10 mm in which an influence of droplets is low. For example, since an influence of droplets further increases in a small-diameter tool with a tool diameter of 1 mm or less, further improvement of service life of the tool is expected by applying the hard coating film of the above example having a few droplets.

Second Example

In the second example, physical properties of a hard coating film formed as a single layer were evaluated using the same tool as the first example. Like Example 1 of the first example, using the sputtering apparatus capable of mounting six sputter evaporation sources, three TiSi-based alloy targets were installed as evaporation sources in the sputtering apparatus.

After the bombardment processing which is the same as that in the first example was performed, the hard coating film was coated on the surface of the tool.

In Example 20, while the in-furnace temperature was maintained at 500° C., Ar gas was introduced at 160 sccm into the furnace of the sputtering apparatus, and then, N₂ gas was introduced at 80 sccm into the furnace so that the in-furnace pressure was adjusted to 0.52 Pa. A DC bias voltage of −40 V was applied to the tool. Power was sequentially applied to the three TiSi-based alloy targets while a discharge time per cycle of power applied to alloy targets containing Ti and Si was set to be 4.0 milliseconds. A time during which power is simultaneously applied to both an alloy target for which application of power is ended and an alloy target for which application of power is started when switching an alloy target to which power is applied was set to be 10 microseconds. In this way, a hard coating film having a thickness of about 2.0 μm was coated. Here, the maximum power density of a power pulse was set to be 2.3 kW/cm², and the average power density was set to be 0.37 kW/cm².

In Example 21, while the in-furnace temperature was maintained at 430° C., Ar gas was introduced at 160 sccm into the furnace of the sputtering apparatus, and then, N₂ gas was introduced at 100 sccm into the furnace so that the in-furnace pressure was adjusted to 0.57 Pa. A DC bias voltage of −40 V was applied to the tool. Power was sequentially applied to the three TiSi-based alloy targets while a discharge time per cycle of power applied to alloy targets containing Ti and Si was set to be 4.0 milliseconds. A time during which power is simultaneously applied to both an alloy target for which application of power is ended and an alloy target for which application of power is started when switching an alloy target to which power is applied was set to be 10 microseconds. In this way, a hard coating film having a thickness of about 2.0 μm was coated. Here, the maximum power density of a power pulse was set to be 2.3 kW/cm², and the average power density was set to be 0.37 kW/cm².

In Example 22, while the in-furnace temperature was maintained at 430° C., Ar gas was introduced at 160 sccm into the furnace of the sputtering apparatus, and then, N₂ gas was introduced at 80 sccm into the furnace so that the in-furnace pressure was adjusted to 0.52 Pa. A DC bias voltage of −40 V was applied to the tool. Power was sequentially applied to the three TiSi-based alloy targets while a discharge time per cycle of power applied to alloy targets containing Ti and Si was set to be 4.0 milliseconds. A time during which power is simultaneously applied to both an alloy target for which application of power is ended and an alloy target for which application of power is started when switching an alloy target to which power is applied was set to be 10 microseconds. In this way, a hard coating film having a thickness of about 2.0 μm was coated. Here, the maximum power density of a power pulse was set to be 2.8 kW/cm², and the average power density was set to be 0.37 kW/cm².

In Comparative Example 20, while the in-furnace temperature was maintained at 430° C., Ar gas was introduced at 160 sccm into the furnace of the sputtering apparatus, and then, N₂ gas was introduced at 80 sccm into the furnace so that the in-furnace pressure was adjusted to 0.52 Pa. A DC bias voltage of −60 V was applied to the tool. Power was sequentially applied to the three TiSi-based alloy targets while a discharge time per cycle of power applied to alloy targets containing Ti and Si was set to be 4.0 milliseconds. A time during which power is simultaneously applied to both an alloy target for which application of power is ended and an alloy target for which application of power is started when switching an alloy target to which power is applied was set to be 10 microseconds. In this way, a hard coating film having a thickness of about 2.0 μm was coated. Here, the maximum power density of a power pulse was set to be 1.5 kW/cm², and the average power density was set to be 0.37 kW/cm².

In Comparative Example 21, while the in-furnace temperature was maintained at 430° C., Ar gas was introduced at 160 sccm into the furnace of the sputtering apparatus, and then, N$_2$ gas was introduced at 60 sccm into the furnace so that the in-furnace pressure was adjusted to 0.47 Pa. A DC bias voltage of −40 V was applied to the tool. Power was sequentially applied to the three TiSi-based alloy targets while a discharge time per cycle of power applied to alloy targets containing Ti and Si was set to be 4.0 milliseconds. A time during which power is simultaneously applied to both an alloy target for which application of power is ended and an alloy target for which application of power is started when switching an alloy target to which power is applied was set to be 10 microseconds. In this way, a hard coating film having a thickness of about 2.0 μm. was coated. Here, the maximum power density of a power pulse was set to be 1.5 kW/cm$^2$, and the average power density was set to be 0.37 kW/cm$^2$.

Like Example 1, coating film properties and a coating film structure were observed for each sample. The results of observing the coating film properties are shown in Table 4.

TABLE 4

|  | Coating film composition (at %) | Ar content ratio (at %) | Crystal structure | I(200)/ I(111) | Average crystal grain size (nm) | Nanoindenetation hardness (GPa) | Elastic coefficient (GPa) |
| --- | --- | --- | --- | --- | --- | --- | --- |
| Example 20 | (Ti82Si18)N | 0.10 | fcc(200) | 4.1 | 9 | 62 | 460 |
| Example 21 | (Ti82Si18)N | 0.09 | fcc(200) | 3.0 | 9 | 51 | 436 |
| Example 22 | (Ti82Si18)N | 0.07 | fcc(200) | 3.8 | 10 | 55 | 456 |
| Comparative Example 20 | (Ti82Si18)N | 0.14 | fcc(200) | 3.7 | 8 | 62 | 460 |
| Comparative Example 21 | (Ti82Si18)N | 0.09 | fcc(200) | 4.1 | 10 | 59 | 479 |

In Examples 20 to 22, the content ratio of Ar was low, and the content ratio of nitrogen in the film thickness direction was 50.0 at % or higher. Also, even at a position at which the depth from the surface was greater than 200 nm, it was confirmed that the amount of oxygen or carbon was small and the content ratio of nitrogen was 50.0 at % or higher in the hard coating films of Examples 20 to 22. A result of measurement of atomic concentration distribution in a depth direction from the surface of the coating film using the scanning X-ray photoelectron spectroscope (Quantum-2000 manufactured by ULVAC-PHI, Inc.) of Example 21 is shown in Table 5. It was confirmed that the content ratio of nitrogen in the film thickness direction was 51.0 at % or higher and, particularly, the content ratio of nitrogen increased in Example 21.

In all of Examples 20 to 22, the hard coating film had a fine crystal grain size, and the presence of a coarse amorphous phase whose circle-equivalent diameter is 5 nm or greater was not confirmed in the microstructure observation. Also, in surface and cross-section observations of the hard coating films of Examples 20 to 22, the presence of coarse droplets whose circle-equivalent diameter exceeds 1.5 μm was not confirmed, and the number of droplets whose circle-equivalent diameter is in a range of 1.0 μm to 1.5 μm was three or less per 100 μm$^2$.

In Comparative Example 20, although the content ratio of nitrogen was 50.0 at % or higher in the film thickness direction, since an absolute value of a negative bias voltage applied to a base material during film formation was made large, the content ratio of Ar increased.

In Comparative Example 21, the flow rate of nitrogen gas during film formation was low, and the content ratio of nitrogen was less than 50.0 at % in the film thickness direction. A result of measurement of atomic concentration distribution in a depth direction from the surface of the coating film using the scanning X-ray photoelectron spectroscope (Quantum-2000 manufactured by ULVAC-PHI, Inc.) of Comparative Example 21 is shown in Table 6. Even when the sputtering method in which power is sequentially applied to targets is applied, it becomes difficult to make the content ratio of nitrogen to be 50.0 at % or higher throughout the film thickness of the hard coating film unless the flow rate of nitrogen gas during film formation is suitable.

TABLE 5

| Depth from surface of coating film (nm) | (at %) | | | | |
| --- | --- | --- | --- | --- | --- |
|  | C | N | O | Si | Ti |
| 20 | 1.6 | 51.5 | 3.4 | 2.3 | 41.2 |
| 40 | — | 52.3 | 3.0 | 2.0 | 42.7 |
| 60 | — | 52.5 | 2.8 | 2.2 | 42.5 |

TABLE 5-continued

| Depth from surface of coating film (nm) | (at %) | | | | |
| --- | --- | --- | --- | --- | --- |
|  | C | N | O | Si | Ti |
| 80 | — | 52.6 | 2.7 | 2.2 | 42.5 |
| 100 | — | 52.3 | 2.9 | 2.3 | 42.5 |
| 120 | — | 51.8 | 3.2 | 2.0 | 43.0 |
| 140 | — | 51.6 | 3.7 | 2.3 | 42.4 |
| 160 | — | 51.6 | 2.6 | 2.2 | 43.6 |
| 180 | — | 52.4 | 2.6 | 2.2 | 42.8 |
| 200 | — | 51.7 | 2.6 | 2.5 | 43.0 |

TABLE 6

| Depth from surface of coating film (nm) | (at %) | | | | |
| --- | --- | --- | --- | --- | --- |
|  | C | N | O | Si | Ti |
| 20 | 1.8 | 49.8 | 3.9 | 0.9 | 43.6 |
| 40 | 1.7 | 49.7 | 4.6 | 0.4 | 43.6 |
| 60 | — | 50.2 | 3.9 | 0.3 | 45.6 |
| 80 | — | 50.6 | 4.7 | 0.4 | 44.3 |
| 100 | — | 50.3 | 3.0 | 0.5 | 46.2 |
| 120 | — | 50.8 | 2.3 | 0.4 | 46.5 |
| 140 | — | 51.5 | 3.4 | 0.3 | 44.8 |
| 160 | — | 50.9 | 3.5 | 0.4 | 45.2 |
| 180 | — | 50.8 | 2.1 | 0.5 | 46.6 |
| 200 | — | 49.4 | 3.3 | 0.8 | 46.5 |

Examples 20 to 22 tended to exhibit more excellent tool service life in comparison to Comparative Examples 20 and 21. Particularly, Example 21 in which the content ratio of nitrogen was high exhibited excellent tool service life.

INDUSTRIAL APPLICABILITY

The coated cutting tool according to the present invention has excellent durability in cut processing of a high-hardness steel or the like, and thus is very useful.

What is claimed is:

1. A coated cutting tool having a hard coating film on a surface of a cutting tool, wherein:
the hard coating film is a nitride, a content ratio of titanium (Ti) with respect to a total amount of metal elements (including semimetal elements) is in a range of 70 at % to 95 at %, a content ratio of silicon (Si) with respect to the total amount of metal elements (including semimetal elements) is in a range of 5 at % to 30 at %, and, with respect to the total amount of metal elements (including semimetal elements) and non-metal elements, the hard coating film contains argon (Ar) at 0.05 at % or more and 0.1 at % or less;
the hard coating film has a NaCl type crystal structure, a face (200) exhibits the maximum intensity, and the hard coating film has an average crystal grain size in a range of 5 nm to 30 nm; and
with respect to a composition at every 20 nm-depth of the hard coating film from a depth of 20 nm to 200 nm, a content ratio of nitrogen is 50.0 at % or higher in a case in which the total content ratio of metal elements (including semimetal elements), nitrogen, oxygen, and carbon is 100 at %.

2. The coated cutting tool according to claim 1, wherein, with respect to the composition at every 20 nm-depth of the hard coating film from the depth of 20 nm to 200 nm, a content ratio of oxygen is 3 at % or less in the case in which the total content ratio of metal elements (including semimetal elements), nitrogen, oxygen, and carbon is 100 at %.

3. The coated cutting tool according to claim 1, wherein, with respect to the composition at every 20 nm-depth of the hard coating film from the depth of 20 nm to 200 nm, a content ratio of carbon is 5 at % or less in the case in which the total content ratio of metal elements (including semimetal elements), nitrogen, oxygen, and carbon is 100 at %.

4. The coated cutting tool according to claim 1, wherein, with respect to the composition at every 20 nm-depth of the hard coating film from the depth of 20 nm to 200 nm, the total content ratio of oxygen and carbon is 3 at % or less in the case in which the total content ratio of metal elements (including semimetal elements), nitrogen, oxygen, and carbon is 100 at %.

5. The coated cutting tool according to claim 1, wherein, in a case in which a structure of the hard coating film is observed with a transmission electron microscope (TEM), the number of amorphous phases whose circle-equivalent diameter is 5 nm or greater present in the hard coating film is one or less within a range of 50 nm×50 nm.

6. The coated cutting tool according to claim 1, wherein a nanoindentation hardness of the hard coating film is in a range of 40 GPa to 60 GPa, and an elastic coefficient of the hard coating film is in a range of 400 GPa to 500 GPa.

7. The coated cutting tool according to claim 1, having an intermediate coating film disposed between the cutting tool and the hard coating film.

8. The coated cutting tool according to claim 1, wherein, in surface and cross-section observations of the hard coating film, a droplet whose circle-equivalent diameter is 1.5 μm or greater is not present, and the number of droplets whose circle-equivalent diameter is 1.0 μm or greater is five or less per 100 μm².

9. The coated cutting tool according to claim 2, wherein, with respect to the composition at every 20 nm-depth of the hard coating film from the depth of 20 nm to 200 nm, a content ratio of carbon is 5 at % or less in the case in which the total content ratio of metal elements (including semimetal elements), nitrogen, oxygen, and carbon is 100 at %.

10. The coated cutting tool according to claim 2, wherein, with respect to the composition at every 20 nm-depth of the hard coating film from the depth of 20 nm to 200 nm, the total content ratio of oxygen and carbon is 3 at % or less in the case in which the total content ratio of metal elements (including semimetal elements), nitrogen, oxygen, and carbon is 100 at %.

11. The coated cutting tool according to claim 3, wherein, with respect to the composition at every 20 nm-depth of the hard coating film from the depth of 20 nm to 200 nm, the total content ratio of oxygen and carbon is 3 at % or less in the case in which the total content ratio of metal elements (including semimetal elements), nitrogen, oxygen, and carbon is 100 at %.

12. The coated cutting tool according to claim 2, wherein, in a case in which a structure of the hard coating film is observed with a transmission electron microscope (TEM), the number of amorphous phases whose circle-equivalent diameter is 5 nm or greater present in the hard coating film is one or less within a range of 50 nm×50 nm.

13. The coated cutting tool according to claim 3, wherein, in a case in which a structure of the hard coating film is observed with a transmission electron microscope (TEM), the number of amorphous phases whose circle-equivalent diameter is 5 nm or greater present in the hard coating film is one or less within a range of 50 nm×50 nm.

14. The coated cutting tool according to claim 4, wherein, in a case in which a structure of the hard coating film is observed with a transmission electron microscope (TEM), the number of amorphous phases whose circle-equivalent diameter is 5 nm or greater present in the hard coating film is one or less within a range of 50 nm×50 nm.

15. The coated cutting tool according to claim 2, wherein a nanoindentation hardness of the hard coating film is in a range of 40 GPa to 60 GPa, and an elastic coefficient of the hard coating film is in a range of 400 GPa to 500 GPa.

16. The coated cutting tool according to claim 3, wherein a nanoindentation hardness of the hard coating film is in a range of 40 GPa to 60 GPa, and an elastic coefficient of the hard coating film is in a range of 400 GPa to 500 GPa.

17. The coated cutting tool according to claim 2, having an intermediate coating film disposed between the tool and the hard coating film.

18. The coated cutting tool according to claim 3, having an intermediate coating film disposed between the tool and the hard coating film.

19. The coated cutting tool according to claim 2, wherein, in surface and cross-section observations of the hard coating film, a droplet whose circle-equivalent diameter is 1.5 μm or greater is not present, and the number of droplets whose circle-equivalent diameter is 1.0 μm or greater is five or less per 100 μm².

20. The coated cutting tool according to claim 3, wherein, in surface and cross-section observations of the hard coating film, a droplet whose circle-equivalent diameter is 1.5 μm or greater is not present, and the number of droplets whose circle-equivalent diameter is 1.0 μm or greater is five or less per 100 μm².

\* \* \* \* \*